(12) United States Patent
Chou et al.

(10) Patent No.: US 7,134,779 B2
(45) Date of Patent: Nov. 14, 2006

(54) LIGHT-EMITTING ELEMENT CIRCUIT

(75) Inventors: Hsien-Ying Chou, Hsinchu (TW); Hung-Min Shih, Changhua (TW)

(73) Assignee: AU Optronics Corp., Hsinchu (TW)

( * ) Notice: Subject to any disclaimer, the term of this patent is extended or adjusted under 35 U.S.C. 154(b) by 25 days.

(21) Appl. No.: 10/732,621

(22) Filed: Dec. 9, 2003

(65) Prior Publication Data

US 2004/0257819 A1 Dec. 23, 2004

(30) Foreign Application Priority Data

Jun. 17, 2003 (TW) .............................. 92116724 A (51) Int. Cl.
*F21V 7/04* (2006.01)
(52) U.S. Cl. ...................... 362/631; 362/249; 362/555; 362/612; 362/800
(58) Field of Classification Search ........ 362/249–250, 362/368, 560–561, 800, 555, 612, 631; 361/749
See application file for complete search history.

(56) References Cited

U.S. PATENT DOCUMENTS

| | | | | |
|---|---|---|---|---|
| 4,298,869 | A * | 11/1981 | Okuno | 345/82 |
| 5,008,788 | A * | 4/1991 | Palinkas | 362/231 |
| 5,400,160 | A * | 3/1995 | Takahashi et al. | 349/60 |
| 5,548,084 | A * | 8/1996 | Tracy | 174/35 R |
| 5,585,783 | A * | 12/1996 | Hall | 340/473 |
| 5,876,427 | A * | 3/1999 | Chen et al. | 607/88 |
| 6,299,337 | B1 | 10/2001 | Bachl et al. | 362/545 |
| 6,329,760 | B1 * | 12/2001 | Bebenroth | 315/200 A |
| 6,366,409 | B1 * | 4/2002 | Umemoto et al. | 359/628 |
| 6,371,637 | B1 * | 4/2002 | Atchinson et al. | 362/555 |
| 6,483,439 | B1 * | 11/2002 | Vukosic | 340/815.65 |
| 6,566,824 | B1 * | 5/2003 | Panagotacos et al. | 315/291 |
| 6,595,651 | B1 * | 7/2003 | Jeong et al. | 362/31 |
| 6,605,826 | B1 * | 8/2003 | Yamazaki et al. | 257/72 |
| 6,665,038 | B1 * | 12/2003 | Endo | 349/149 |
| 6,667,780 | B1 * | 12/2003 | Cho | 349/58 |
| 6,719,436 | B1 * | 4/2004 | Lin et al. | 362/31 |
| 6,789,921 | B1 * | 9/2004 | Deloy et al. | 362/252 |
| 2002/0041155 | A1 * | 4/2002 | Asami et al. | 313/583 |
| 2002/0048163 | A1 * | 4/2002 | Kawakami et al. | 362/31 |
| 2002/0105263 | A1 * | 8/2002 | Kim | 313/498 |
| 2003/0112627 | A1 * | 6/2003 | Deese | 362/249 |
| 2003/0143766 | A1 * | 7/2003 | Ishikawa et al. | 438/22 |
| 2003/0227769 | A1 * | 12/2003 | Osawa | 362/31 |
| 2004/0212982 | A1 * | 10/2004 | Chang | 362/31 |

FOREIGN PATENT DOCUMENTS

| | | | |
|---|---|---|---|
| JP | 10-049065 | * | 2/1998 |
| JP | 10-201504 | * | 11/1998 |
| JP | 2000-047243 | * | 2/2000 |

(Continued)

*Primary Examiner*—Ali Alavi
*Assistant Examiner*—Jason Moon Han
(74) *Attorney, Agent, or Firm*—Fish & Richardson P.C.

(57) ABSTRACT

A light-emitting element circuit. The light-emitting element circuit disposed on a FPC includes a plurality of light-emitting element sub-circuits arranged in parallel in the FPC. Each light-emitting element sub-circuit includes at least one first light-emitting element disposed on a first region of the FPC, and at least one second light-emitting element disposed on a second region of the FPC. The number of the second light-emitting elements is equal to the number of the first light-emitting elements. A current is inputted to the first region, flowing through the first light-emitting elements and the second light-emitting elements sequentially, and is outputted from the second region.

26 Claims, 6 Drawing Sheets

FOREIGN PATENT DOCUMENTS

| | | | |
|---|---|---|---|
| JP | 2001-330830 | * | 11/2001 |
| JP | 2002-083506 | * | 3/2002 |
| JP | 2002-333847 | * | 11/2002 |

* cited by examiner

LIGHT-EMITTING ELEMENT CIRCUIT

BACKGROUND OF THE INVENTION

1. Field of the Invention

The invention relates to a liquid crystal display (LCD) device, and more particularly to a light-emitting element circuit disposed in a flexible printed circuit (hereinafter is referred to as FPC) and a LCD device comprising the flexible printed circuit.

2. Description of the Related Art

Figure 1:
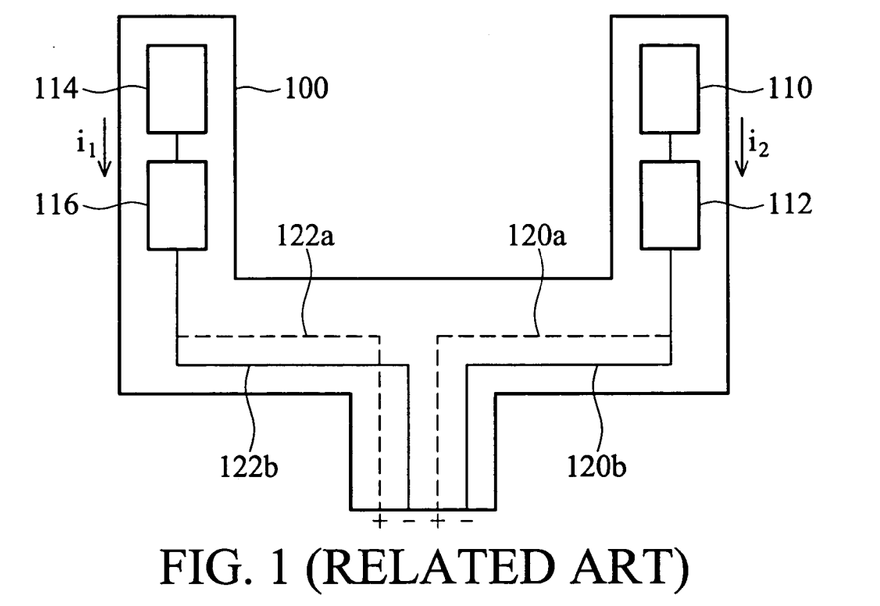
FIG. 1 is a cross-section illustrating an FPC of a typical light emitting diode (LED)

FIG. 1 is a cross-section illustrating a typical light emitting diode (LED) FPC. As shown in FIG. 1, a light-emitting element circuit comprises LEDs 110, 112, 114, and 116. The light-emitting element circuit is arranged in an FPC 100. The LEDs 110 and 112 are connected in series by the line 120 and are arranged in one side of the FPC 100. The LEDs 114 and 116 are connected in series by the line 122 and are arranged in an opposing side of the FPC 100. The line 120 is divided into a first part 120b (shown as a solid line) and a second part 120a (shown as a dashed line). The line 122 is divided into a first part 122b (shown in the solid line) and a second part 122a (shown in the dashed line). A positive current $I_2$ flows through the LED 110 and the LED 112 sequentially via the lines 120a and outputs through the lines 120b. A positive current $i_1$ flows through the LED 114 and the LED 116 sequentially via the lines 122a and outputs through the lines 122b. The inner impedances of LEDs 110, 112, 114, and 116 are different. The impedance difference is about 10~20 ohms. Thus, in the structure, the current $i_2$ is not equal to the current $I_1$. If the difference between the inner impedance of each LED is larger, the difference in value between the current $I_2$ and the current $I_1$ increases. This difference in impedance diminishes the quality of light brightness by the device comprising the FPC 100, thereby reducing the uniformity. Additionally, positive and negative power lines are arranged alternately, thus production of the FPC is complex.

SUMMARY OF THE INVENTION

An object of the present invention is not only to provide a less complex light-emitting element circuit but also to provide a much better brightness uniformity in LCD modules. Positive and negative power lines are arranged separately in the FPC for balancing the LED current and reducing production complexity.

The present invention provides a liquid crystal display (LCD) device wherein an LED FPC comprises a light-emitting element circuit. Brightness uniformity of the LCD device is not affected by the difference between the inner impedance of each light-emitting element composed of the light-emitting element circuit, and thereby achieves excellent brightness uniformity.

The present invention provides a light-emitting element circuit disposed in a FPC. The light-emitting element circuit comprises a plurality of light-emitting element sub-circuits arranged in parallel in the FPC. Each light-emitting element sub-circuit comprises at least one first light-emitting element disposed in a first side of the FPC and at least one second light-emitting element disposed in a second side of the FPC. The number of second light-emitting elements is equal to the number of first light-emitting elements. A current is inputted to the first side, flows through the second light-emitting elements and the first light-emitting elements sequentially, and is outputted from the second side.

The present invention provides another light-emitting element circuit disposed in a FPC. The light-emitting element circuit comprises a plurality of first light-emitting elements arranged in parallel in a first side of the FPC, and a plurality of second light-emitting elements arranged in parallel in a second side of the FPC. The number of the light-emitting elements on the sides is the same. A current is inputted to the first side, flows through the second light-emitting elements sequentially, and is outputted from the second side.

Furthermore, the present invention also provides a liquid crystal display device. The liquid crystal display device comprises a liquid crystal display panel and a light unit. The light unit comprises a FPC, a light guide plate and a light guide pipe. A light-emitting element circuit is disposed in the FPC. One implementation of the light-emitting element circuit comprises a plurality of light-emitting element sub-circuits arranged in parallel in the FPC. Each light-emitting element sub-circuit comprises at least one first light-emitting element disposed in a first side of the FPC and at least one second light-emitting element disposed in a second side of the FPC. Another implementation of the light-emitting element circuit comprises a plurality of first light-emitting elements arranged in parallel in a first side of the FPC, and a plurality of second light-emitting elements arranged in parallel in a second side of the FPC. The number of the second side light-emitting elements is equal to the number of first side light-emitting elements. A current is inputted to the first side, flows through the second light-emitting elements and the first light-emitting elements sequentially, and is outputted from the second side. The light guide plate is above the liquid crystal display panel. The light guide pipe is coupled between the light guide plate and the FPC.

DESCRIPTION OF THE DRAWINGS

The present invention is herein described by way of exemplary embodiments, but not limitations, illustrated in the accompanying drawings in which like references denote similar elements, and in which.

DETAILED DESCRIPTION OF THE INVENTION

Figure 2:
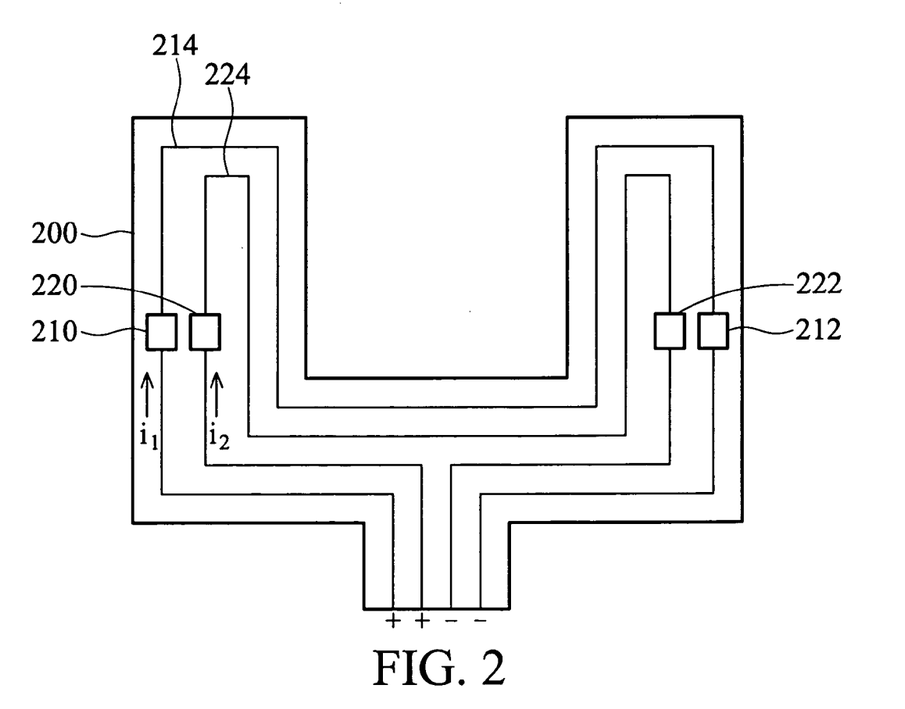
FIG. 2 is a cross-section illustrating a LED FPC comprising a light-emitting element circuit in the first embodiment of the invention.

FIG. 2 is a cross-section illustrating a light emitting diode (LED) FPC comprising a light-emitting element circuit in the first embodiment of the invention. Two groups of light-emitting element sub-circuits and two LEDs comprised in each group are given as examples to illustrate the embodiment. As shown in FIG. 2, the first light-emitting element sub-circuit comprises LEDs 210 and 212. The second comprises LEDs 220 and 222. The two light-emitting element sub-circuits are arranged in parallel in the FPC 200.

The LEDs 210 and 212 are connected in series via a line 214. The LEDs 210 and 212 are arranged in different sides of the FPC 200. The LEDs 220 and 222 are connected in series via a line 224. The LEDs 220 and 222 are arranged in different sides of the FPC 200. The LEDs 210 and 220 are arranged in one side of the FPC 200. The LEDs 212 and 222 are arranged in the other side of the FPC 200. The lines 214 and 224 are shown as real lines whether the lines 214 and 224 can be seen in the FPC 200.

A positive current $i_1$ is inputted to one side of the FPC 200, flows through the LED 210 and the LED 212 sequentially via the line 214 and is outputted from the other side of the FPC 200. A positive current $i_2$ is inputted to one side of the FPC 200, flows through the LED 220 and the LED 222 sequentially via the line 224 and is outputted from the other side of the FPC 200. The inner impedance of each LED is different. Thus, the current $i_2$ is not equal to the current $i_1$. The total current in each side, however, is equal (both equal to i1+i2). Thus, light emitted from the left side of the LCD device comprising the FPC 200 is nearly the same as light from the right side of the LCD device. In addition, positive and negative power lines are arranged separately in the FPC 200, thereby reducing device complexity and easy to handle.

Figure 3A:
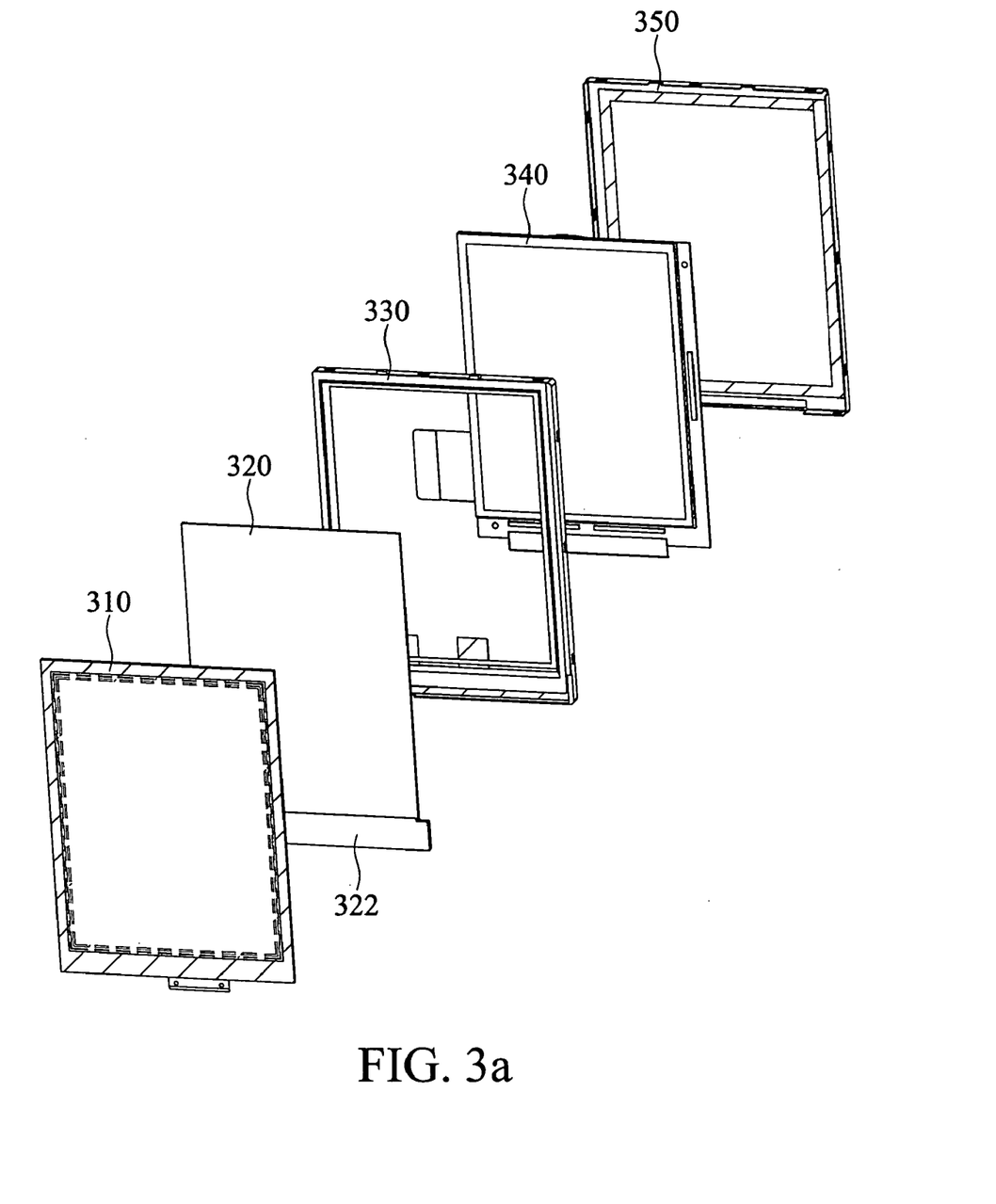
FIG. 3a is a block diagram illustrating a liquid crystal display device according to the first embodiment of the invention.

FIG. 3a is a block diagram illustrating a liquid crystal display device according to the first embodiment of the invention. The LCD display in a Personal Digital Assistant (PDA) is given as an example to illustrate the embodiment.

As shown in FIG. 3a, a liquid crystal display device comprises a touch panel 310, a front light unit 320, a front frame 330, a TFT panel 340 and a back bezel 350. The touch panel 310 receives user input. The front light unit 320 is coupled between the touch panel 310 and the front frame 330 and above the TFT panel 340. The front light unit 320 comprises an FPC 322. The TFT panel 340 is coupled between the front frame 330 and the back bezel 350 and is protected by the front frame 330 and the back bezel 350.

The structure shown in FIG. 3a is nearly the same as the LCD device in a typical PDA, the major difference is that the design of the FPC 322 is different from the typical FPC design. The detail illustration and the cross-section of the FPC 322 are shown in FIG. 2.

Figure 3B:
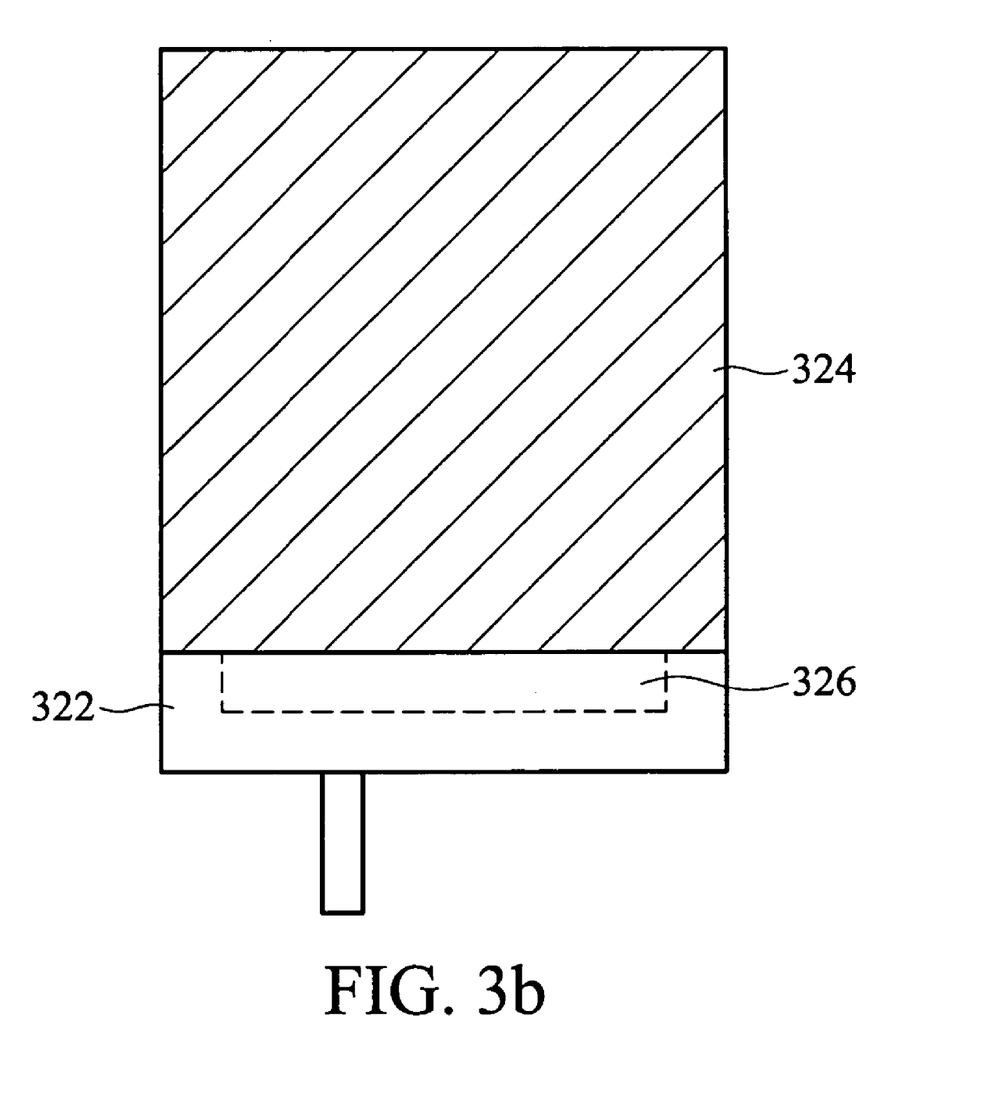
FIG. 3b is a block diagram illustrating the front light unit in the first embodiment of the invention.

FIG. 3b is a block diagram illustrating the front light unit 320. The front light unit 320 comprises an LED FPC 322, a light guide plate 324 and a light guide pipe 326. The light guide plate 324 is coupled to the TFT panel 340 shown in FIG. 3a. The light guide pipe 326 is coupled between the light guide plate 324 and the FPC 322. The illustration in FIG. 2 shows a cross-section of the FPC 322 and the light-emitting element circuit of the FPC 322. Referring to the above illustration, the inner impedance of each LED is different. The current flowing through the LEDs is also different. The total current flowing to both sides of the FPC is the same. Thus, the front light unit 320 provides excellent uniformity.

Figure 4:
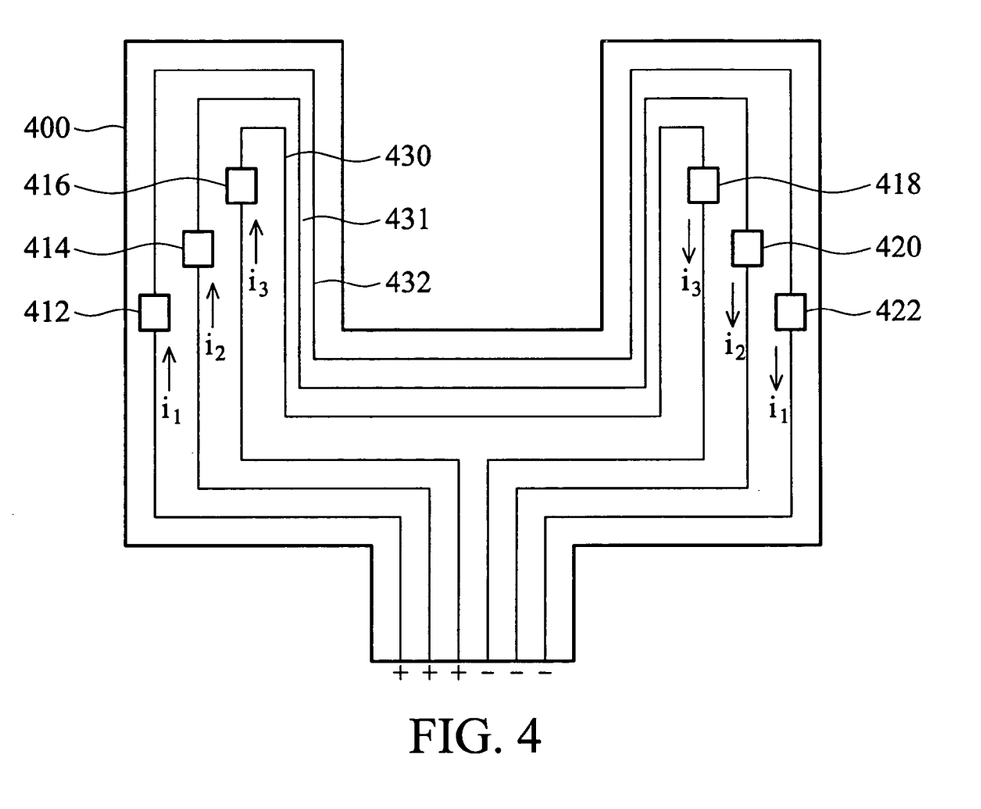
FIG. 4 is a cross-section illustrating an LED FPC comprising a light-emitting element circuit in the second embodiment of the invention.

FIG. 4 is a cross-section illustrating a light emitting diode (LED) FPC comprising a light-emitting element circuit in the second embodiment of the invention. A light-emitting element circuit comprising six LEDs is given as an example to illustrate the embodiment. The light-emitting element circuit comprises LEDs 412, 414, 416, 418, 420 and 422. The LEDs 412 and 422 are connected in series via the line 432. The LEDs 414 and 420 are connected in series via the lines 431. The LEDs 416 and 418 are connected in series via the lines 430. The LEDs 412, 416, 418 are arranged in one side of the FPC 400. The LEDs 418, 420, 422 are arranged in the other side of the FPC 400. The lines 430, 431 and 432 are shown as real lines whether the lines 430, 431 and 432 can be seen in the FPC 400.

A positive current $i_1$ is inputted to one side of the FPC 400, flows through the LED 412 and the LED 422 sequentially via the line 432 and is outputted from the other side of the FPC 400. A positive current $i_2$ is inputted to one side of the FPC 400, flows through the LED 414 and the LED 420 sequentially via the line 431 and is outputted from the other side of the FPC 400. A positive current $i_3$ is inputted to one side of the FPC 400, flows through the LED 416 and the LED 418 sequentially via the line 430 and is outputted from the other side of the FPC 400. The inner impedance of each LED is different. Thus, the currents $i_1$, $i_2$, and $i_3$ are different. The total current on each side (both equal to $i_1+i_2+i_3$) is, however, the same. Thus, the light from the left side of the LCD device comprising the FPC 400 is nearly the same as the light from the right side of the LCD device. Moreover, positive and negative power lines are arranged separately in the FPC 400, thereby reducing complexity.

Figure 5A:
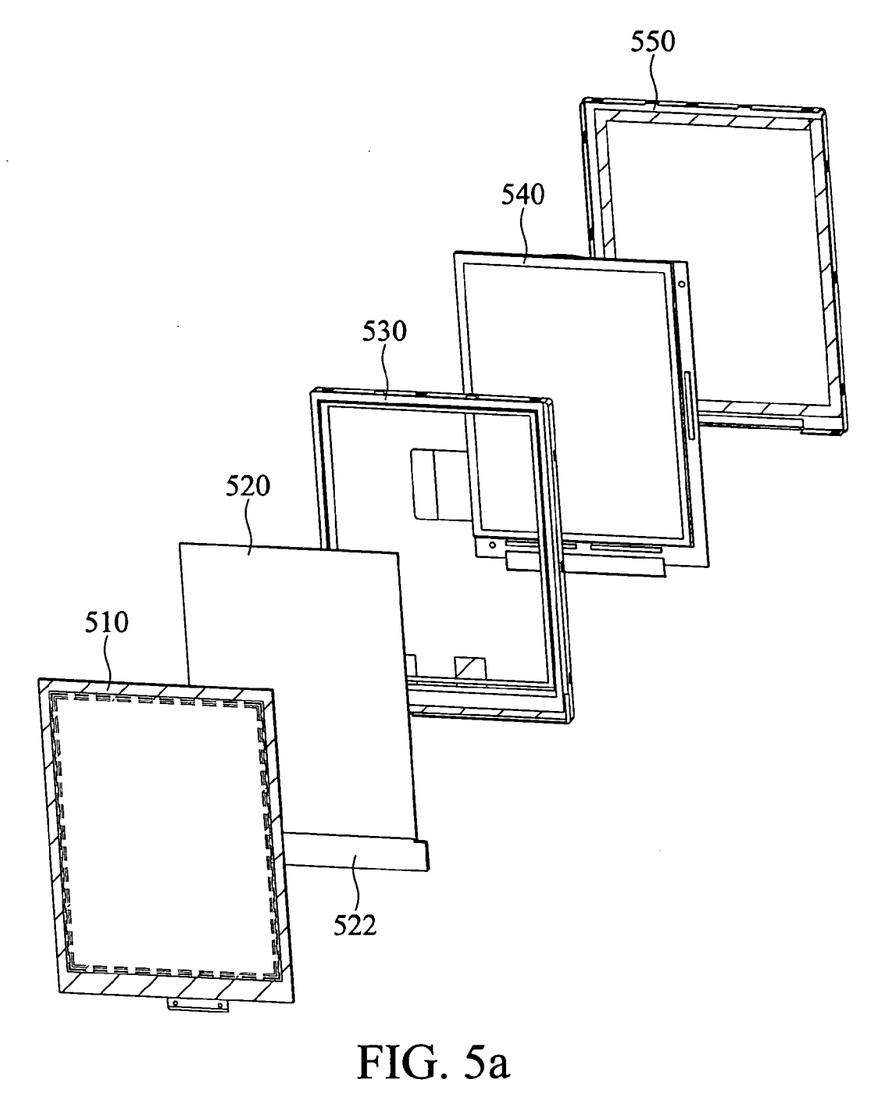
FIG. 5a is a block diagram illustrating a liquid crystal display device according to the second embodiment of the invention.

FIG. 5a is a block diagram illustrating a liquid crystal display device according to the first embodiment of the invention. A LCD display of a Personal Digital Assistant (PDA) is given as example to illustrate the embodiment shown in FIG. 5a.

As shown in FIG. 5a, a liquid crystal display device comprises a touch panel 510, a front light unit 520, a front frame 530, a TFT panel 540 and a back bezel 550. The touch panel 510 receives user input. The front light unit 520 is coupled between the touch panel 510 and the front frame 530 and above the TFT panel 540. The front light unit 520 comprises an FPC 522. The TFT panel 540 is coupled between the front frame 530 and the back bezel 550 and is protected by the front frame 530 and the back bezel 550.

The structure shown in FIG. 5a is nearly the same as the LCD device of a typical PDA. The major difference being that the design of the FPC 522 is different from the design of the typical FPC. FIG. 4 shows a detailed illustration and cross-section of the FPC 522.

Figure 5B:
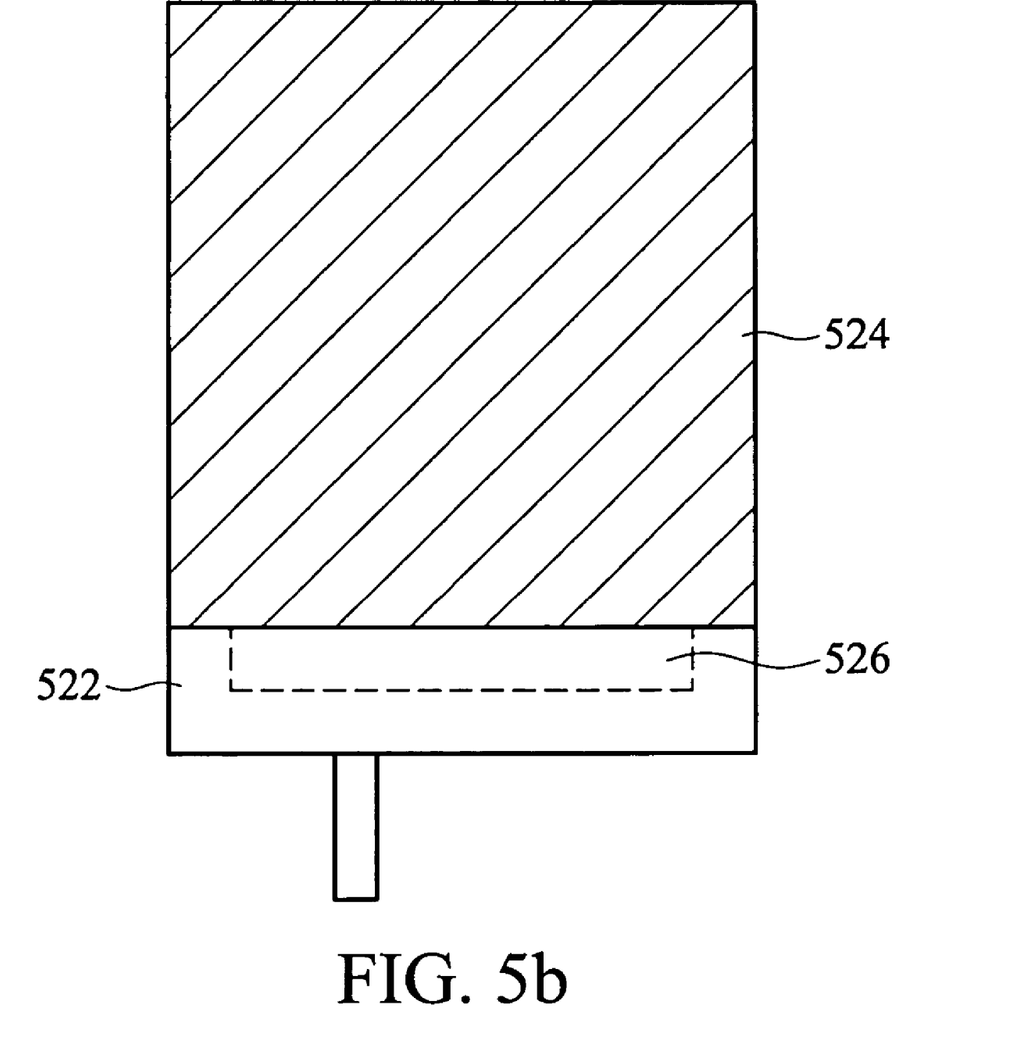
FIG. 5b is a block diagram illustrating the front light unit in the second embodiment of the invention.

FIG. 5b is a block diagram illustrating the front light unit 520. The front light unit 520 comprises an FPC 522, a light guide plate 524 and a light guide pipe 526. The light guide plate 524 is coupled to the TFT panel 540 shown in FIG. 5a. The light guide pipe 526 is coupled between the light guide plate 524 and the FPC 522. The cross-section of the FPC 522 and the light-emitting element circuit of the FPC 522 are shown in FIG. 4. Referring to the above illustration, because the inner impedance of each LED is different, the current flowing through the LEDs is different. The total current flowing to both sides of the FPC is, however, the same. Thus, the front light unit 520 provides excellent uniformity.

In other embodiments, other light-emitting elements, such as laser diodes, can replace the LEDs.

The light-emitting element circuit disposed in the FPC provided by the invention is used in a light unit of a LCD and can increase the uniformity of the light unit. Additionally, positive and negative power lines are arranged separately in the FPC, thereby reducing complexity.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A light-emitting element circuit disposed on a FPC, comprising:
   a first light-emitting element sub-circuit comprising a first light-emitting element disposed on a first region of the FPC, and a second light-emitting element disposed on a second region separated from the first region of the FPC; and
   a second light-emitting element sub-circuit coupled to the first light-emitting element sub-circuit in parallel, comprising a third light-emitting element disposed on the first region of the FPC and a fourth light-emitting element disposed on the second region separated from the first region of the FPC;
   wherein a first current flows through the first light-emitting element and the second light-emitting element sequentially, a second current different from the first current flows through the third light-emitting element and the fourth light-emitting element sequentially, and current path lengths of the first current and the second current are different.

2. The light-emitting element circuit of claim 1, wherein the first light-emitting element, the second light-emitting element, the third light-emitting element, and the fourth light-emitting element are light-emitting diodes.

3. The light-emitting element circuit of claim 1, wherein the first light-emitting element, the second light-emitting element, the third light-emitting element, and the fourth light-emitting element are laser diodes.

4. The light-emitting element circuit of claim 1, wherein a sum of the first current and the second current in the first region is equal to that in the second region.

5. The light-emitting element circuit of claim 1, wherein lengths of current paths differ between adjacent light-emitting elements.

6. A light-emitting element circuit disposed on a FPC (flexible printed circuit), the FPC having a first surface and a second surface, the light-emitting element circuit comprising:
   a first light-emitting element sub-circuit comprising a first light-emitting element disposed on a first region of the FPC and a second light-emitting element disposed on a second region separated from the first region of the FPC; and
   a second light-emitting element sub-circuit coupled to the first light-emitting element sub-circuit in parallel, comprising a third light-emitting element disposed on the first region of the FPC and a fourth light-emitting element disposed on the second region separated from the first region of the FPC;
   wherein a first current flows through the first light-emitting element and the second light-emitting element sequentially, a second current different from the first current flows through the third light-emitting element and the fourth light-emitting element sequentially; and
   wherein both the first region and the second region are on the first surface of the FPC.

7. The light-emitting element circuit of claim 6, wherein the first light-emitting element, the second light-emitting element, the third light-emitting element, and the fourth light-emitting element are light-emitting diodes.

8. The light-emitting element circuit of claim 6, wherein the first light-emitting element, the second light-emitting elements, the third light-emitting element, and the fourth light-emitting element are laser diodes.

9. The light-emitting element circuit of claim 6, wherein current path lengths of the first current and the second current are different.

10. The light-emitting element circuit of claim 6, wherein lengths of current paths differ between adjacent light-emitting elements.

11. The light-emitting element circuit of claim 6, wherein a sum of the first current and the second current in the first region is equal to that in the second region.

12. The light-emitting element circuit of claim 6, wherein the first light-emitting element sub-circuit and the second light-emitting element sub-circuit are coplanar.

13. The light-emitting element circuit of claim 6, wherein the first light-emitting element and the second light-emitting element are connected in serial, and the third light-emitting element and the fourth light-emitting element are connected in serial.

14. A liquid crystal display device comprising:
    a liquid crystal display panel; and
    a light unit coupled to the liquid crystal display panel, comprising:
      a FPC where a light-emitting circuit is arranged, the FPC having a first surface and a second surface, wherein the light emitting element circuit comprises:
        a first light-emitting element sub-circuit comprising a first light-emitting element disposed on a first region of the FPC and a second light-emitting element disposed on a second region separated from the first region of the FPC; and
        a second light-emitting element sub-circuit coupled to the first light-emitting element sub-circuit in parallel, comprising a third light-emitting element disposed on the first region of the FPC and a fourth light-emitting element disposed on the second region separated from the first region of the FPC;
        wherein a first current flows through the first light-emitting element and the second light-emitting element sequentially, a second current different from the first current flows through the third light-emitting element and the fourth light-emitting element sequentially; and
        wherein both the first region and the second region are on the first surface of the FPC;
    a light guide plate coupled to the liquid crystal display panel; and
    a light guide pipe coupled between the light guide plate and the FPC.

15. The liquid crystal display device of claim 14 wherein the first light-emitting element, the second light-emitting element, the third light-emitting element, and the fourth light-emitting element are light-emitting diodes.

16. The liquid crystal display device of claim 14 wherein the first light-emitting element, the second light-emitting element, the third light-emitting element, and the fourth light-emitting element are laser diodes.

17. The liquid crystal display device of claim 14, wherein current path lengths of the first current and the second current are different.

18. The liquid crystal display device of claim 14, wherein lengths of current paths differ between adjacent light-emitting elements.

19. The light-emitting element circuit of claim 14, wherein a sum of the first current and the second current in the first region is equal to that in the second region.

20. The light-emitting element circuit of claim 14, wherein the first light-emitting element sub-circuit and the second light-emitting element sub-circuit are coplanar.

21. The light-emitting element circuit of claim 14, wherein the first light-emitting element and the second light-emitting element are connected in serial, and the third light-emitting element and the fourth light-emitting element are connected in serial.

22. A liquid crystal display device comprising:
- a liquid crystal display panel; and
- a light unit coupled to the liquid crystal display panel, comprising:
  - a FPC where a light-emitting element circuit is arranged, wherein the light emitting element circuit comprising:
    - a first light-emitting element sub-circuit comprising a first light-emitting element disposed on a first region of the FPC, and a second light-emitting element disposed on a second region separated from the first region of the FPC; and
    - a second light-emitting element sub-circuit coupled to the first light-emitting element sub-circuit in parallel, comprising a third light-emitting element disposed on the first region of the FPC and a fourth light-emitting element disposed on the second region separated from the first region of the FPC;
  - wherein a first current flows through the first light-emitting element and the second light-emitting element sequentially, a second current different from the first current flows through the third light-emitting element and the fourth light-emitting element sequentially, and current path lengths of the first current and the second current are different;
  - a light guide plate coupled to the liquid crystal display panel; and
  - a light guide pipe coupled between the light guide plate and the FPC.

23. The liquid crystal display device of claim 22 wherein the first light-emitting element, the second light-emitting element, the third light-emitting element, and the fourth light-emitting element are light-emitting diodes.

24. The liquid crystal display device of claim 22 wherein the first light-emitting element, the second light-emitting element, the third light-emitting element, and the fourth light-emitting element are laser diodes.

25. The liquid crystal display device of claim 22, wherein a sum of the first current and the second current in the first region is equal to that in the second region.

26. The liquid crystal display device of claim 22, wherein lengths of current paths differ between adjacent light-emitting elements.

* * * * *